United States Patent
Mizosaki et al.

[11] Patent Number: 6,087,632
[45] Date of Patent: Jul. 11, 2000

[54] HEAT PROCESSING DEVICE WITH HOT PLATE AND ASSOCIATED REFLECTOR

[75] Inventors: Kengo Mizosaki, Kumamoto; Masaaki Yoshida, Kumamoto-ken, both of Japan

[73] Assignee: Tokyo Electron Limited, Japan

[21] Appl. No.: 09/227,874

[22] Filed: Jan. 11, 1999

[51] Int. Cl.[7] .......................... H01L 21/27; H01L 21/324
[52] U.S. Cl. ................ 219/390; 219/405; 219/444.1; 219/468.2; 392/418; 118/725
[58] Field of Search .................... 219/390, 405, 219/411, 444.1, 468.2, 455.12; 392/416, 418; 118/725, 724, 50.1, 726, 728

[56] References Cited

U.S. PATENT DOCUMENTS

| | | | |
|---|---|---|---|
| 3,836,751 | 9/1974 | Anderson | 219/411 |
| 5,462,603 | 10/1995 | Murakami | 118/725 |
| 5,467,220 | 11/1995 | Xu | 219/405 |
| 5,635,093 | 6/1997 | Arena et al. | 118/725 |
| 5,834,737 | 11/1998 | Hirose et al. | 219/385 |
| 5,844,205 | 12/1998 | White et al. | 219/390 |

FOREIGN PATENT DOCUMENTS

| | | |
|---|---|---|
| 55-55536 | 4/1980 | Japan . |
| 62-118519 | 5/1987 | Japan . |
| 63-241921 | 10/1988 | Japan . |
| 4-127516 | 4/1992 | Japan . |
| 6-53145 | 2/1994 | Japan . |
| 8-139047 | 5/1996 | Japan . |
| 10-326788 | 12/1998 | Japan . |

*Primary Examiner*—John A. Jeffery
*Attorney, Agent, or Firm*—Rader, Fishman & Grauer

[57] ABSTRACT

A heat processing device includes a hot plate on which a substrate is placed, a heater press-fitted in the hot plate for heating the substrate through the hot plate, and a reflecting plate facing an underside and side faces of the hot plate at a distance therefrom for reflecting heat radiated from the hot plate. An outside frame is arranged on the surface of the hot plate so as to surround the substrate.

17 Claims, 8 Drawing Sheets

HEAT PROCESSING DEVICE WITH HOT PLATE AND ASSOCIATED REFLECTOR

BACKGROUND OF THE INVENTION

The present invention relates to a heat processing device for processing large-sized substrates, for example, LCD substrates and the like by heating.

In the manufacture of liquid crystal displays (LCDs), a circuit pattern is formed by a so-called photolithography technique wherein a photoresist liquid is applied to an LCD substrate of glass to form a resist film thereon, and the resist film is then exposed to light according to the circuit pattern, followed by a developing process.

More specifically, for example, an LCD substrate is cleaned in a cleaning device and then subjected to an adhesion process in an adhesion device, and after the substrate is cooled in a cooling device, a photoresist film is coated on a surface of the LCD substrate in a resist coating device. Subsequently, the photoresist film is heated for baking in a heat processing device, and the substrate is exposed to a predetermined pattern of light in an exposure device. The LCD substrate which has thus been exposed to light is then applied with a developer and developed in a developing device and the developer is washed off with a rinsing liquid, thereby completing a developing process.

The heat processing device used for heating the LCD substrate in the above-described developing process comprises, for example, a hot plate on which the LCD substrate is placed, a heater for heating the LCD substrate through the hot plate, a ventilation cover arranged so as to define a processing space in cooperation with the hot plate and having a vent hole in the center of a ceiling thereof, and a shutter for shutting off the processing space.

Meanwhile, there has recently been an increasing demand for enlargement of LCD substrates, and large-sized substrates of, for example, 840×650 mm, which are much larger than conventional substrates of 650×550 mm, are in demand. However, when such a large-sized LCD substrate is subjected to the heating process as described above, the processing temperature is liable to become uneven within the surface of the LCD substrate. For example, the larger the size of the LCD substrate, the greater the difference in temperature between the central and peripheral portions of the LCD substrate tends to become.

Accordingly, when larger-sized LCD substrates are to be processed, factors that affect the processing temperature within the heat processing device need to be controlled more strictly. Variation in the temperature distribution of the LCD substrate can be caused by a variety of factors, and conceivably one of the factors is radiation of heat from the hot plate. Specifically, the bottom surface and side faces of the hot plate are exposed to the atmosphere within the processing space, and thus heat is liable to radiate therefrom, causing a temperature difference between the central and peripheral portions of the hot plate. Such a temperature difference of the hot plate eventually causes a temperature difference between the central and peripheral portions of the LCD substrate, with the result that thermal evenness on the surface of the LCD substrate lowers.

Ventilation of the processing space during the heating process is also a factor of the temperature difference. In the aforementioned baking process in which the photoresist film formed on the LCD substrate is heated, solvent (e.g., thinner) in the photoresist film volatilizes due to heat, and to remove the vapor of the solvent from the processing space, air is let out through the vent hole in the ventilation cover. The flow of air produced due to the ventilation brings about a drop of the temperature of the outside of the hot plate or the LCD substrate, and such a drop of temperature, or disturbance, causes a temperature difference between the central and peripheral portions of the hot plate or the LCD substrate.

Hot plates conventionally used are formed by casting with a heater built therein. As a result of a recent trend for larger-sized LCD substrates, there is a demand for hot plates having higher response to heat and smaller thickness and weight. However, the thickness of cast-type hot plates can only be reduced to 40 mm or thereabouts due to restrictions imposed by the manufacturing process, and thus cast-type hot plates are associated with drawbacks such as poor response to heat, difficulty in reducing weight, and increased height of the device.

BRIEF SUMMARY OF THE INVENTION

An object of the present invention is to provide a heat processing device capable of achieving improved evenness of processing temperature within the surface of an object under a heating process even if the object is large in size.

According to a first aspect of the present invention, there is provided a heat processing device comprising: a casing; a hot plate arranged inside the casing for heating an object which is placed on or above the hot plate; a heater for heating the hot plate; and a reflecting plate for reflecting heat radiated from the hot plate, wherein the reflecting plate has a bottom portion facing an underside of the hot plate, and side wall portions facing respective side faces of the hot plate.

According to a second aspect of the present invention, there is provided a heat processing device comprising: a casing; a hot plate arranged inside the casing for heating an object which is placed on or above the hot plate; a heater for heating the hot plate; and an outside frame arranged on a portion of the hot plate where the object is to be arranged, so as to surround the object.

According to a third aspect of the present invention, there is provided a heat processing device comprising: a casing; a hot plate arranged inside the casing for heating an object which is placed on or above the hot plate; a heater for heating the hot plate; a ventilation cover arranged above the hot plate with a processing space defined therebetween and having a vent hole; and a shutter arranged so as to surround the processing space and movable toward and away from the ventilation cover, wherein a gap formed between the ventilation cover and the shutter during a heating process is set to a value such that, when the processing space is ventilated via the vent hole, a flow of air along side faces of the hot plate is suppressed by a flow of air introduced into the processing space through the gap, to thereby lessen variation in temperature of the hot plate.

According to a fourth aspect of the present invention, there is provided a heat processing device comprising: a casing; a hot plate arranged inside the casing for heating an object which is placed on or above the hot plate; a heater for heating the hot plate; a reflecting plate for reflecting heat radiated from the hot plate; an outside frame arranged on a portion of the hot plate where the object is to be arranged, so as to surround the object; a ventilation cover arranged above the hot plate with a processing space defined therebetween and having a vent hole; and a shutter arranged so as to surround the processing space and movable toward and away from the ventilation cover, wherein the reflecting plate has a bottom portion facing an underside of the hot plate and side wall portions facing respective side faces of the hot plate, and a gap formed between the ventilation cover and the shutter during a heating process is set to a value such that, when the processing space is ventilated via the vent hole, a flow of air along the side faces of the hot plate is suppressed by a flow of air introduced into the processing space through the gap, to thereby lessen variation in temperature of the hot plate.

According to a fifth aspect of the present invention, there is provided a heat processing device comprising: a casing; a hot plate arranged inside the casing for heating an object which is placed on or above the hot plate; and a heater arranged in the hot plate, wherein the heater is press-fitted in a recess formed in the hot plate.

According to the first aspect of the present invention, the reflecting plate is provided to reflect heat radiated from the hot plate, whereby heat radiated from the hot plate can be reflected to the hot plate. The reflecting plate has a bottom portion facing the underside of the hot plate and side wall portions facing the respective side faces of the hot plate. Since the reflecting plate is so arranged as to correspond in position to a region of the hot plate where much heat is radiated, radiated heat can be reflected to this region and accordingly, thermal evenness of the hot plate can be enhanced.

According to the second aspect of the present invention, the outside frame is arranged on the portion of the hot plate where an object is placed, so as to surround the object, and thus entry of air to a region around the object is restrained. Consequently, disturbance is suppressed and evenness of the processing temperature within the surface of the object can be enhanced.

According to the third aspect of the present invention, during the heating process, the processing space is ventilated in a semi-closed state in which the shutter is held at a position near the ventilation cover and thus the processing space is imperfectly closed because of the gap between the ventilation cover and the shutter. In this case, two air flows are produced due to ventilation, that is, a flow of air introduced into the processing space through the gap and an upward flow of air along the side faces of the hot plate. If, of the two air flows, the flow of air along the side faces of the hot plate is large, excessive heat is removed from the side faces of the hot plate and thus thermal evenness of the hot plate is lost. Therefore, the gap between the ventilation cover and the shutter is set to a value such that the flow of air along the side faces of the hot plate is suppressed by the flow of air introduced into the processing space through the gap, to thereby lessen variation in temperature of the hot plate. Consequently, heat removal from the side faces of the hot plate is suppressed, making it possible to improve thermal evenness of the hot plate.

According to the fourth aspect of the present invention, the reflecting plate is provided to reflect heat radiated from the hot plate (first aspect of the present invention), the outside frame is arranged on the portion of the hot plate where an object is placed, so as to surround the object (second aspect of the present invention), and the gap formed between the ventilation cover and the shutter during the heating process is set to a value such that, when the processing space is ventilated via the vent hole, the flow of air along the side faces of the hot plate is suppressed by the flow of air introduced into the processing space through the gap, to thereby lessen variation in temperature of the hot plate (third aspect of the present invention). Thanks to a multiplier effect of these technical features, thermal evenness of the hot plate can be greatly improved.

According to the fifth aspect of the present invention, since the heater is press-fitted in the recess formed in the hot plate, the thickness of the hot plate need not be increased, unlike the conventional cast-type hot plate. The thickness of the hot plate can therefore be made small, compared with the conventional hot plate, so that the hot plate may be higher in response to heat, smaller in weight and more resistant to disturbance.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be hereinafter described in detail with reference to the accompanying drawings.

Figure 1:
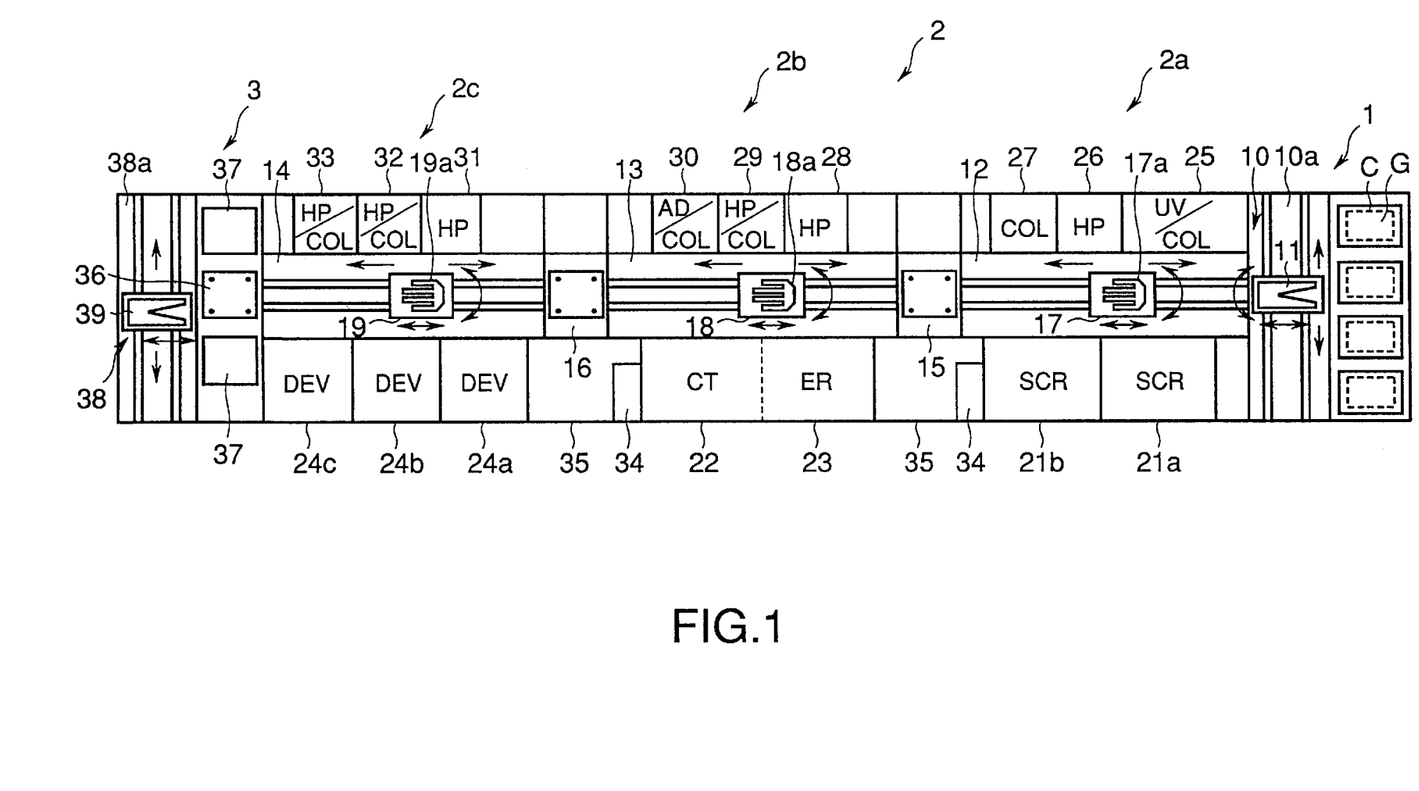
FIG. 1 is a schematic plan view of a coating-developing system for LCD substrates to which the present invention is applied.

FIG. 1 is a plan view of a coating-developing system for LCD substrates to which the present invention is applied.

The coating-developing system comprises a cassette station 1 on which cassettes C each containing a plurality of substrates G are placed, a processing section 2 including a plurality of processing units for subjecting the substrates G to a series of processes including resist coating and development, and an interface section 3 for transferring the substrates G to and from an exposure device (not shown). The cassette station 1 and the interface section 3 are arranged at opposite ends of the processing section 2.

The cassette station 1 has a transporting mechanism 10 for transporting an LCD substrate between each of the cassettes C, which are transferred to and from the cassette station 1, and the processing section 2. The transporting mechanism 10 includes a transporting arm 11 movable on a transportation path 10a extending in a direction of the row of the cassettes C, and each substrate G is transported between the cassette C and the processing section 2 by the transporting arm 11.

The processing section 2 is divided into a pre-stage section 2a, a mid-stage section 2b and a post-stage section 2c having transportation paths 12, 13 and 14 respectively in the center thereof, and various processing units are arranged on both sides of each of these transportation paths. Relay sections 15 and 16 are arranged at respective two junctions of the three transportation paths.

The pre-stage section 2a has a main transporting device 17 movable along the transportation path 12. On one side of the transportation path 12, two cleaning units (SCR) 21a and 21b are arranged, and on the other side of the transportation path 12, an ultraviolet radiation/cooling unit 25 having an ultraviolet radiation device (UV) and a cooling device (COL) placed one upon the other, a heat processing unit 26 having two heat processing devices (HP) placed one upon the other, and a cooling unit 27 having two cooling devices (COL) placed one upon the other are arranged.

The mid-stage section 2b similarly has a main transporting device 18 movable along the transportation path 13. On one side of the transportation path 13, a resist coating unit (CT) 22 and a peripheral resist removing unit (ER) 23 for removing a resist on the peripheral portion of the substrate G are arranged in a manner integrally combined with each other. On the other side of the transportation path 13, a heat processing unit 28 having two heat processing devices (HP) placed one upon the other, a heating/cooling unit 29 having a heat processing device (HP) and a cooling device (COL) placed one upon the other, and an adhesion/cooling unit 30 having an adhesion device (AD) and a cooling device (COL) placed one upon the other are arranged.

The post-stage section 2c also has a main transporting device 19 movable along the transportation path 14. On one side of the transportation path 14, three developing units (DEV) 24a, 24b and 24c are arranged, and on the other side of the transportation path 14, a heat processing unit 31 having two heat processing devices (HP) placed one upon the other and two heating/cooling units 32 and 33 each having a heat processing device (HP) and a cooling device (COL) placed one upon the other are arranged.

The main transporting devices 17, 18 and 19 are each provided with X- and Y-axis driving mechanisms for causing motion in two directions in a horizontal plane, a Z-axis driving mechanism for causing motion in a vertical direction, and a rotatory driving mechanism for causing rotation about the Z axis, and also include arms 17a, 18a and 19a for supporting a substrate G, respectively.

The processing section 2 has an arrangement such that only spinner type units such as the cleaning unit 21a, the resist coating unit 22 and the developing unit 24a are arranged on one side of the transportation paths while only heat-related processing units such as the heat processing units, the cooling unit, etc. are arranged on the other side of the transportation paths.

On the same side of the relay sections 15 and 16 as the spinner type units, chemical feeding units 34 are arranged and also spaces 35 are provided to permit maintenance.

The interface section 3 includes an extension 36 for temporarily keeping a substrate when transferring the substrate to and from the processing section 2, two buffer stages 37 arranged on both sides of the extension to permit buffer cassettes to be placed thereon, and a transporting mechanism 38 for transporting a substrate G between the exposure device (not shown) and the buffer cassette. The transporting mechanism 38 has a transporting arm 39 movable on a transportation path 38a extending in a direction along which the extension 36 and the buffer stages 37 are arranged, and the substrates G are transported between the processing section 2 and the exposure device by the transporting arm 39.

By arranging the processing units collectively into an integrated whole in this manner, it is possible to save space and enhance the processing efficiency.

In the coating-developing system constructed as described above, a substrate G in the cassette C is transported to the processing section 2. In the processing section 2, first, the substrate is subjected to a surface modification-cleaning process in the ultraviolet radiation device (UV) of the ultraviolet radiation/cooling unit 25 in the pre-stage section 2a and then cooled in the cooling device (COL) of the same unit, and after the substrate is subjected to scrubber cleaning in the cleaning units (SCR) 21a and 21b, it is heated and dried in one of the heat processing devices (HP) arranged in the pre-stage section 2a and then cooled in one of the cooling devices (COL) of the cooling unit 27.

Subsequently, the substrate G is transported to the mid-stage section 2b where it is subjected to an adhesion process (HMDS process) in the adhesion device (AD) located at the upper level of the unit 30, to enhance the adhesion of a resist to be formed, and then cooled in the cooling device (COL) located at the lower level of the same unit, and after the substrate G is applied with a resist in the resist coating unit (CT) 22, surplus resist at the peripheral edge portion of the substrate is removed in the peripheral resist removing unit (ER) 23. The substrate G is then subjected to a prebaking process in one of the heat processing devices (HP) arranged in the mid-stage section 2b and is cooled in the cooling device (COL) located at the lower level of the unit 29 or 30.

Then, the substrate G is transported from the relay section 16 to the interface section 3 by the main transporting device 19 and then to the exposure device to be exposed to a predetermined pattern of light. Subsequently, the substrate G is again transported to the system via the interface section 3, and after a postexposure-baking process is performed as needed on the substrate in one of the heat processing devices (HP) in the post-stage section 2c, the substrate is subjected to a developing process in one of the developing units (DEV) 24a, 24b and 24c to form a predetermined circuit pattern thereon. The substrate G which has thus been developed is subjected to a postbaking process in one of the heat processing devices (HP) of the post-stage section 2c, then cooled in the cooling device (COL), and transported by the main transporting devices 19, 18 and 17 and the transporting mechanism 10 to a predetermined cassette on the cassette station 1 to be contained therein.

The heat processing devices (HP) incorporated in the above coating-developing system will be now described, taking the one arranged in the mid-stage section 2b as an example.

Figure 2:
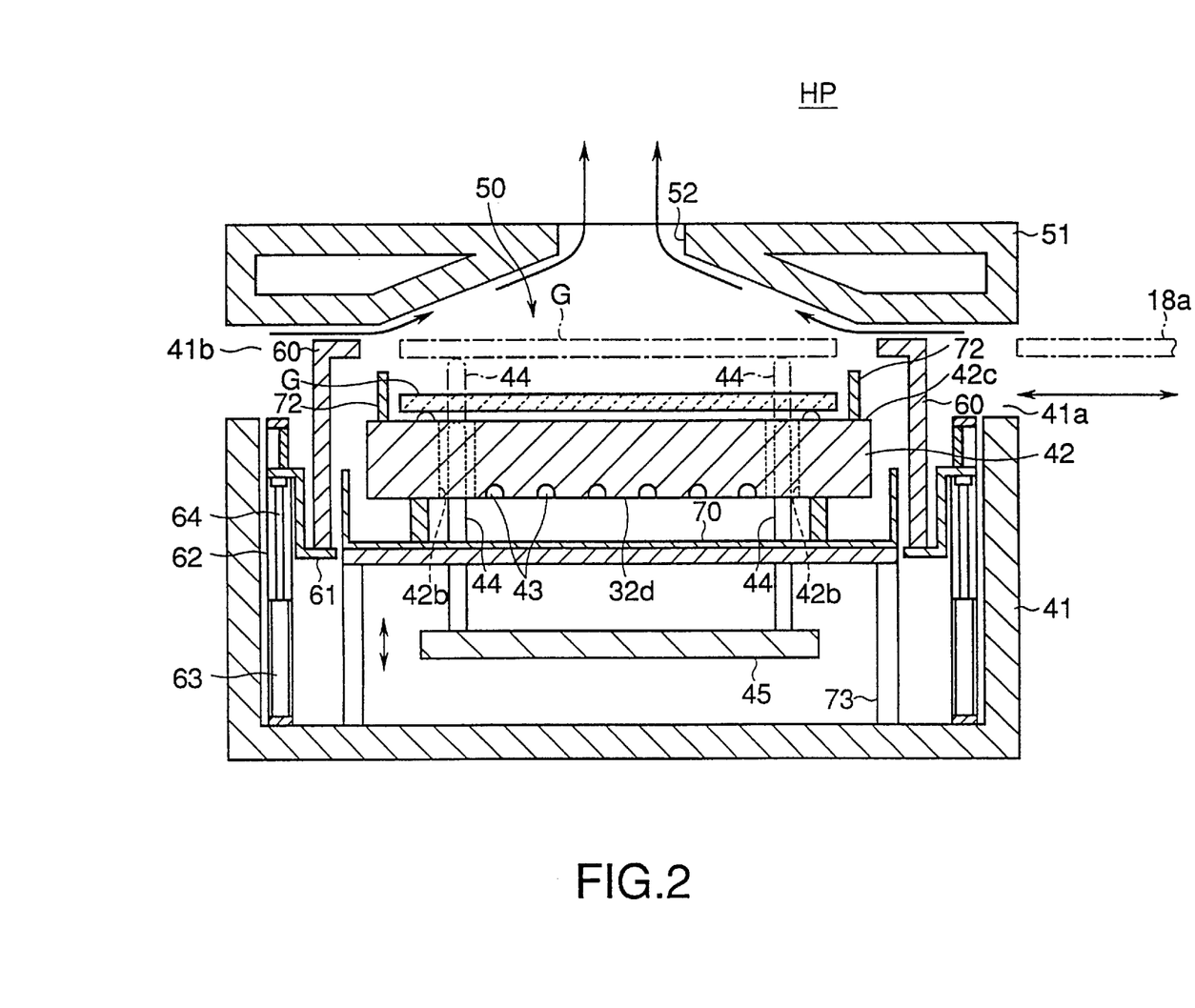
FIG. 2 is a sectional view of a heat processing device according to one embodiment of the present invention, which is incorporated in the system of FIG. 1.

As shown in FIG. 2, the heat processing device (HP) comprises a casing 41, a hot plate 42 for heating a substrate G placed inside the casing 41, a ventilation cover 51 arranged so as to cover an upper portion of the casing 41 while defining a processing space 50 in cooperation with the hot plate 42, and a shutter 60 surrounding the processing space 50 and movable toward and away from the ventilation cover 51. A vent hole 52 is formed in the center of a ceiling of the ventilation cover 51.

The casing 41 has an opening 41a opening to the transportation path 13 and a substrate G is transferred through the opening 41a by the transporting arm 18a of the main transporting device 18. A similar opening 41b is formed in the casing at a location opposite the opening 41a, and these openings 41a and 41b function as air inlets. The air inlets arranged on opposite sides of the casing serve to reduce a difference of air flow rate between the substrate inlet/outlet side and a side opposite thereto, and thus a difference between the flow rate of air which cools the substrate inlet/outlet side of the hot plate 42 and that of air which cools the opposite side of the same, whereby the distribution of temperature of a region above the hot plate is made even. Consequently, in the case of the prebaking process, evenness of the thickness of the resist film can be improved. The air inlets to be formed are not limited to two but may be four in number.

Figure 3A:
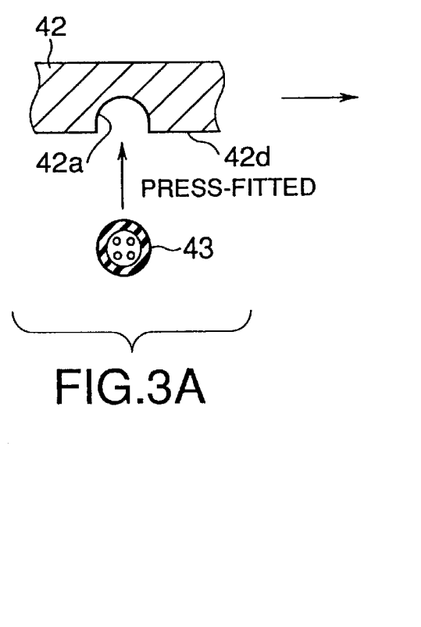
FIGS. 3A and 3B are sectional views respectively showing states before and after a heater is press-fitted in a hot plate.
Figure 3B:
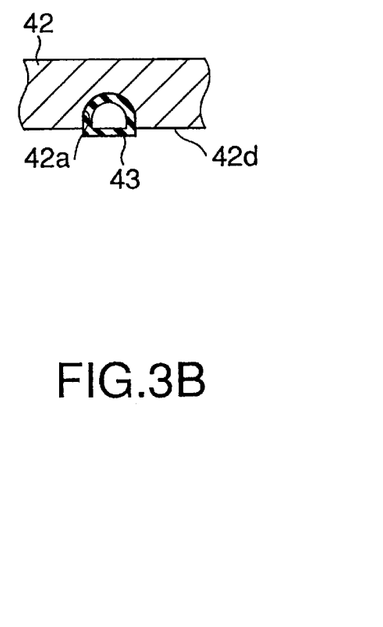

The hot plate 42 is made of an aluminum alloy, for example, and has a thickness of, for example, 30 mm. A heater 43 for heating the hot plate 42 is arranged on a reverse side, or an underside, of the hot plate 42. The heater 43 is in the form of a pipe and is press-fitted in each of a plurality of recesses 42a formed in the underside 42d of the hot plate 42 as shown in FIG. 3A. Thus, the heater is embedded in the hot plate 42 as shown in FIG. 3B.

The hot plate 42 is further provided with a temperature sensor, not shown, and the processing temperature is fed back to a control section, not shown, so that it can be set at a predetermined processing temperature of 120 to 150° C., for example.

The hot plate 42 has, for example, four through holes 42b formed therethrough. Supporting pins 44 for supporting a substrate G at the time of transfer thereof are inserted through the respective through holes 42b. The supporting pins 44 are held by a holding member 45 arranged under the hot plate 42. The holding member 45 is coupled to a lifting mechanism (not shown) so that as the holding member 45 is moved up or down by the lifting mechanism, the supporting pins 44 may be projected from or retracted beneath the surface 42c of the hot plate 42.

The substrate G may be placed on the hot plate 42; alternatively, it may be of a proximity type which remains held by the supporting pins 44 or a spacer (not shown) at a position above the hot plate 42 so as not to be in direct contact with the hot plate.

Figure 4:
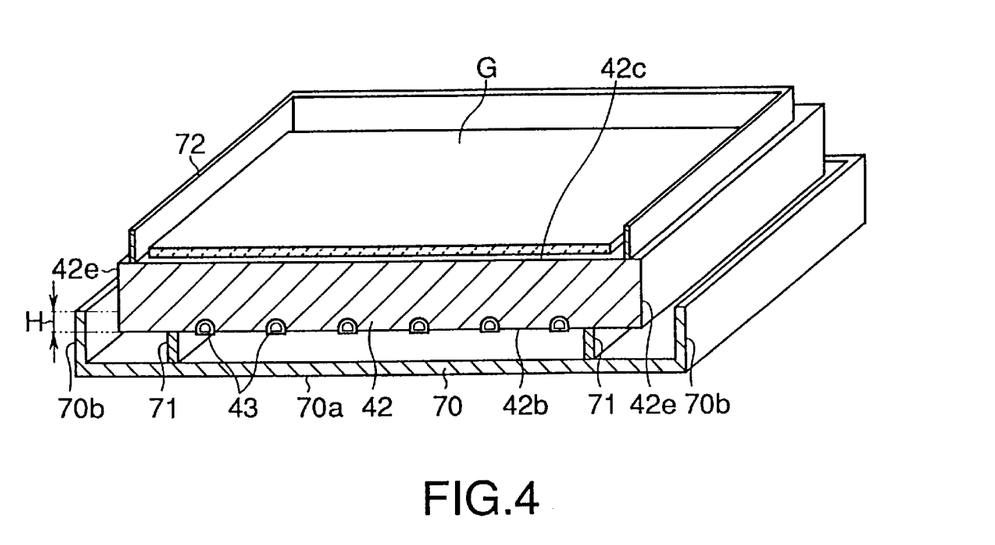
FIG. 4 is a sectional perspective view showing the hot plate of the heat processing device of FIG. 2.

A reflecting plate 70 for reflecting heat radiated from the hot plate 42 is arranged within the casing 41. The reflecting plate 70 has, as shown in FIG. 4, for example, a bottom portion 70a facing the underside 42d of the hot plate 42 at a predetermined distance therefrom, and side wall portions 70b facing respective side faces 42e of the hot plate 42 at a predetermined distance therefrom.

As shown in FIG. 2, the reflecting plate 70 is placed on a base member 73 set up on the bottom of the casing 41. Further, as shown in FIG. 4, the hot plate 42 is placed on the bottom portion 70a of the reflecting plate 70 with spacers 71 interposed therebetween, so that the hot plate 42 is separated from the bottom portion 70a of the reflecting plate 70.

The distance between the hot plate 42 and the reflecting plate 70 is not particularly limited and is preferably set to a suitable value such that the degree of thermal evenness of the hot plate 42 is highest.

An outside frame 72 is arranged on the surface 42c of the hot plate 42 so as to surround the substrate G at a small distance therefrom. The height of the outside frame 72 is not particularly limited insofar as it is at a level higher than the surface of the substrate G, and is set to, for example, 5 mm.

Figure 5:
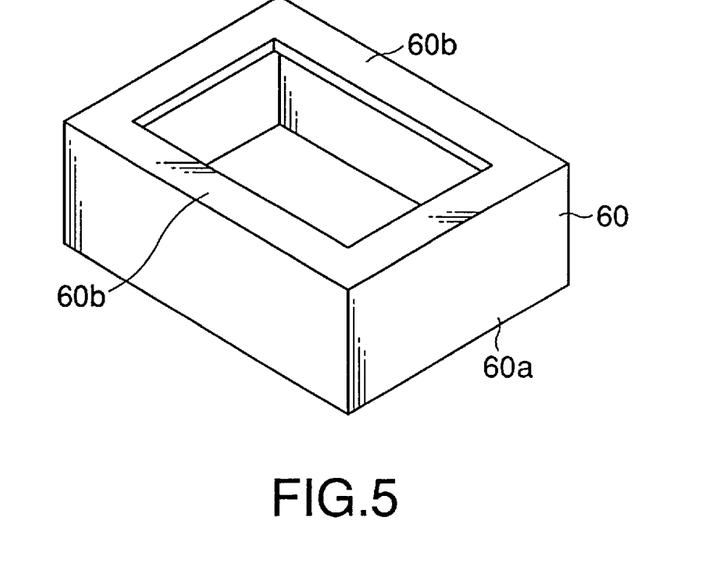
FIG. 5 is a perspective view showing a shutter of the heat processing device of FIG. 2.

As shown in FIG. 5, the shutter 60 has a rectangular body 60a and a horizontal portion 60b continuous with the upper end of the body and extending inward therefrom. The horizontal portion 60b causes air introduced from outside to flow along the lower surface of the ventilation cover 51, thereby preventing the air from flowing toward the substrate G. Consequently, the temperature distribution within the surface of the substrate G can be flattened, making it possible to enhance evenness of the thickness of the resist film.

Figure 6:
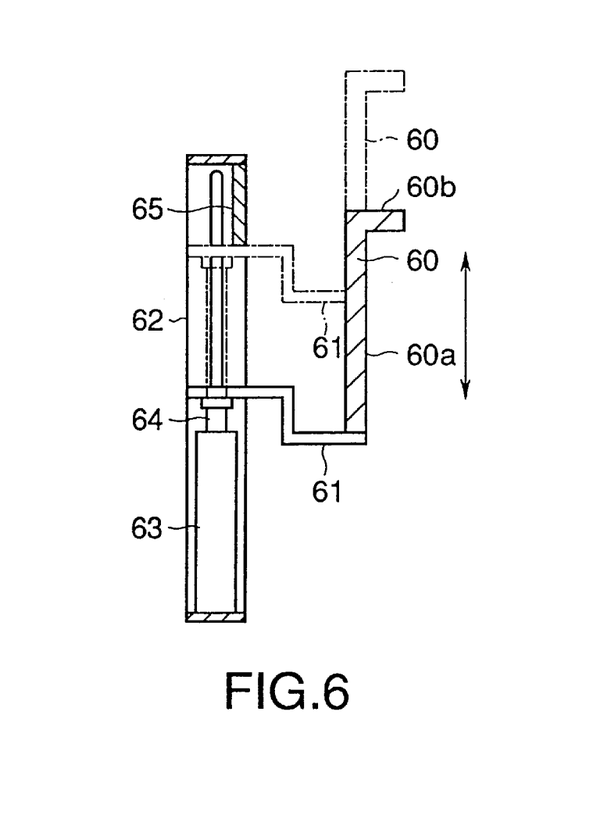
FIG. 6 is a sectional view showing a lifting mechanism for the shutter of the heat processing device of FIG. 2.

Brackets 61 protrude from the respective centers of opposite lower ends of the body 60a. As shown in FIG. 6, the brackets 61 are each vertically movably held by a guide member 62 set up on the bottom of the casing 41. Specifically, each bracket 61 is coupled to a piston rod 64 of an air cylinder 63 serving as lifting means so that it can be moved up and down as the air cylinder 63 is driven. The shutter 60 can therefore be moved up and down by the air cylinder 63 toward and away from the ventilation cover 51.

Figure 7:
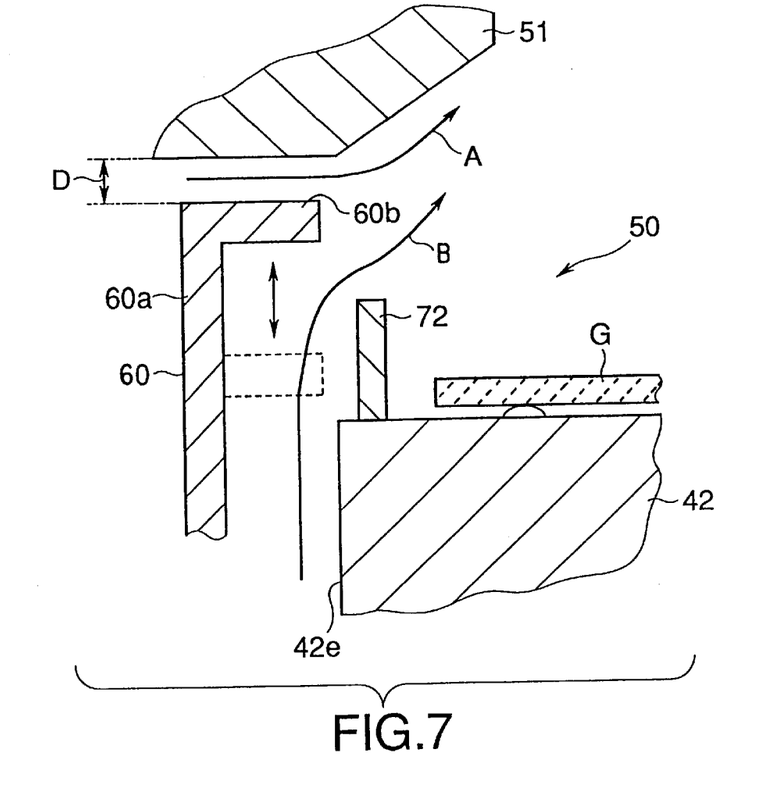
FIG. 7 is a sectional view showing a state of the shutter of the heat processing device of FIG. 2 during a heating process.

A stopper 65 is attached to an upper end portion of each guide member 62. The stopper 65 becomes engaged with the bracket 61 when the bracket 61 is lifted, to stop the shutter 60 at a predetermined position. The uppermost stop position of the shutter 60 is set at a level such that a gap D is provided between the shutter 60 and the ventilation cover 51, as shown in FIG. 7.

During the heating process, the shutter 60 is lifted to its uppermost position so that the processing space 50 may be ventilated in a semi-closed state in which the space 50 is imperfectly closed because of the gap D between the ventilation cover 51 and the shutter 60. In this case, as a result of ventilation, two air flows are produced as shown in FIG. 7, that is, a flow of air introduced into the processing space 50 through the gap D (hereinafter referred to as the "supply air flow A") and a flow of air along the side faces 42e of the hot plate 42 (hereinafter referred to as the "side air flow B").

If, of these two air flows, the side air flow B is too large, heat is removed excessively from the side faces 42e of the hot plate 42, and thus the temperature difference between the central and peripheral portions of the hot plate 42 becomes large, impairing the thermal evenness. As a result, evenness of the processing temperature within the surface of the substrate G is lowered.

The supply air flow A and the side air flow B are produced by ventilation, as stated above, and accordingly, provided the processing space is ventilated at a constant rate, the two air flows have a relationship such that as the supply air flow A is increased, the side air flow B decreases; conversely, as the supply air flow A is decreased, the side air flow B increases.

Since the rate of the supply air flow A can be changed by varying the gap D between the ventilation cover 51 and the shutter 60, the gap D is set so as to increase the supply air flow A relative to the side air flow B and thereby restrict the side air flow B by the supply air flow A so that the temperature difference within the hot plate 42 may be small. Specifically, the gap D is set to 15 to 20 mm.

The vent hole 52 is connected to ventilating means, not shown, whereby the atmosphere in the processing space 50 is discharged to the outside.

Figure 8:
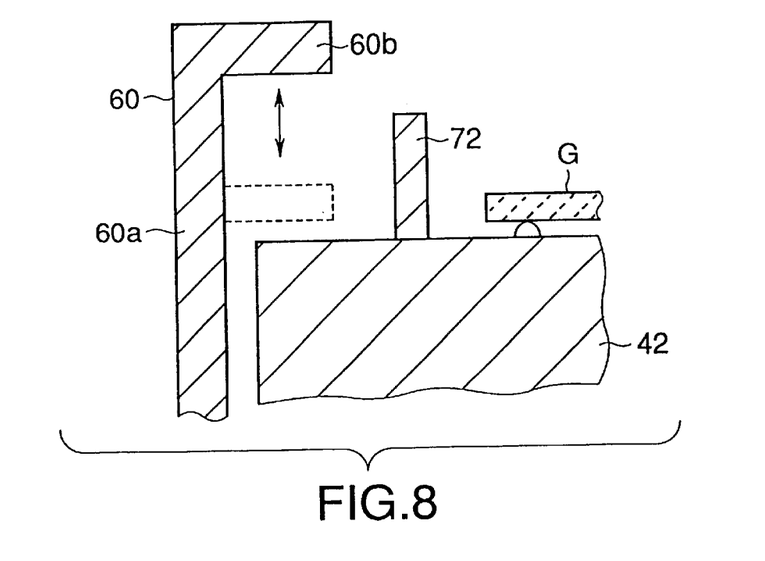
FIG. 8 is a sectional view showing, by way of example, another state of the shutter of the heat processing device of FIG. 2 during the heating process.

As shown in FIG. 7, the inward edge of the horizontal portion 60b of the shutter 60 extends to a position in the vicinity of the peripheral edge of the hot plate 42, and therefore, when the shutter 60 is moved down, the upward flow of air from the bottom of the hot plate 42 is blocked, whereby the hot plate 42 is prevented from being cooled. This effect can be furthered by making the inward edge portion of the horizontal portion 60b overlap with the peripheral edge portion of the hot plate 42, as shown in FIG. 8.

Figure 9:
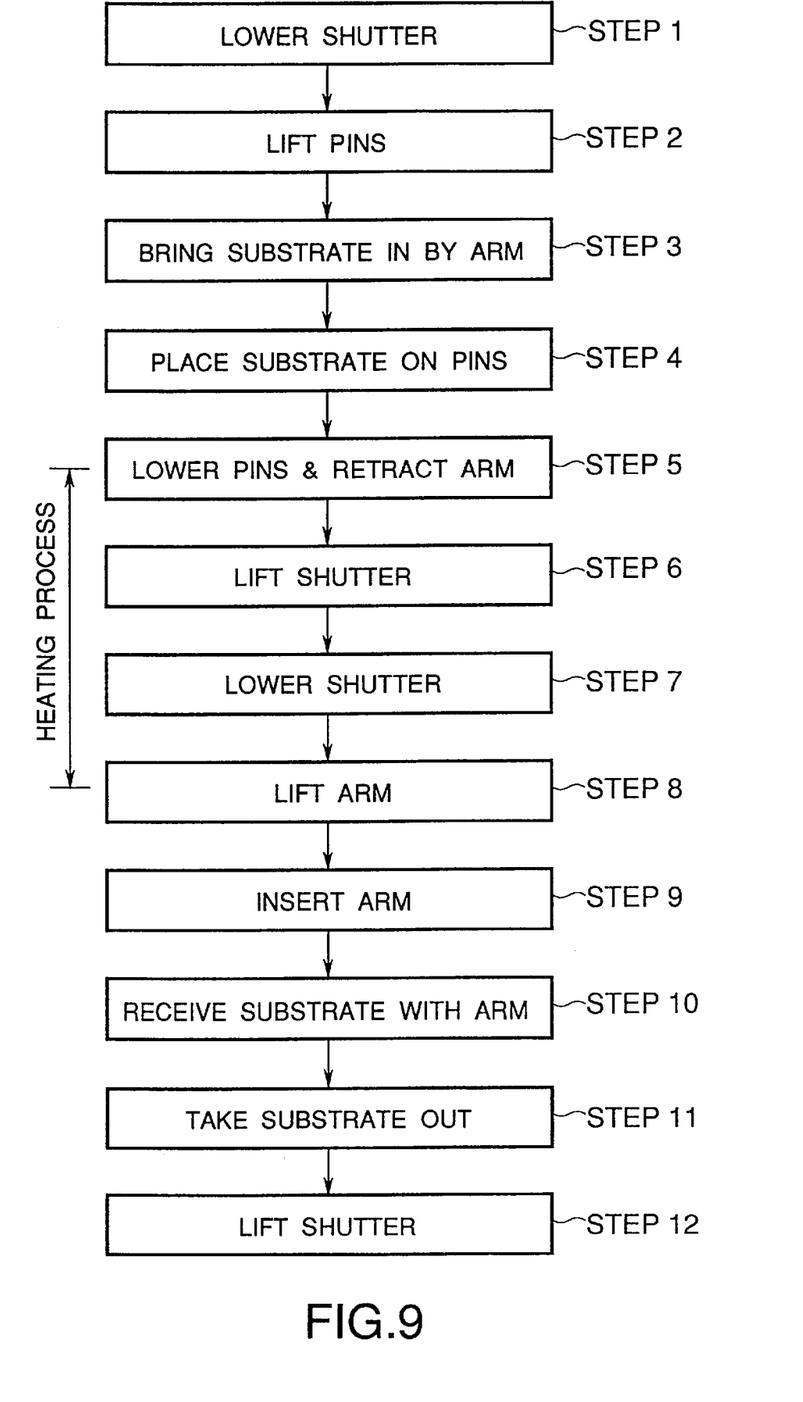
FIG. 9 is a flowchart illustrating a process performed by the heat processing device of FIG. 2.

Referring now to FIG. 9, the heating process of the heat processing device (HP) constructed as above will be described.

First, the shutter 60 is moved down (STEP 1), and the pins 44 are lifted (STEP 2). A substrate G is then brought into the casing 41 by the transporting arm 18a (STEP 3) and placed on the pins 44 (STEP 4). Subsequently, the pins 44 are lowered and at the same time the transporting arm 18a is retracted (STEP 5). Then, the heating process is started, and immediately after the start of the heating process, the shutter 60 is moved up (STEP 6).

After the substrate is processed with heat applied thereto for a predetermined time, the shutter 60 is moved down (STEP 7), and then the pins 44 are moved up to lift the substrate G (STEP 8), whereupon the heating process is completed.

Then, with the substrate G lifted, the transporting arm 18a is extended to a position under the substrate G (STEP 9) and then moved up, whereby the substrate G is received by the arm 18a (STEP 10). Subsequently, the substrate G is conveyed to the outside by the transporting arm 18a (STEP 11), and then the shutter 60 is moved up (STEP 12).

The reflecting plate 70 for reflecting heat radiated from the hot plate 42 is provided, and therefore, during the heating process performed on the substrate G, the radiated heat is reflected by the reflecting plate toward the hot plate 42. Since the reflecting plate 70 faces the underside 42d and side faces 42e of the hot plate 42 at a distance therefrom, heat can be reflected toward the underside 42d and the side faces 42e from which much heat is radiated. It is therefore possible to suppress a local temperature drop of the hot plate 42, especially a temperature drop of the peripheral portion of the hot plate 42, and as a consequence, thermal evenness of the hot plate 42 can be enhanced.

The side wall portions 70b of the reflecting plate 70 and the side faces 42e of the hot plate 42 are preferably positioned in such a manner that they partly overlap with each other, as shown in FIG. 4, in order to allow heat to be appropriately radiated from the side faces 42e of the hot plate 42. The height by which the two overlap with each other (hereinafter referred to as the "overlap height H") is set to ⅓ to ½ (in the illustrated example, 10 to 15 mm) of the thickness (in the illustrated example, 30 mm) of the hot plate 42. If the overlap height H is too large, the temperature of the peripheral portion of the hot plate 42 becomes excessively high due to the reflection of heat radiated from the hot plate 42, with the result that thermal evenness of the hot plate 42 is lost.

The heat processing device (HP) is provided with the outside frame 72 arranged on the surface 42c of the hot plate 42 so as to surround the substrate G, and this outside frame 72 prevents air from entering a region around the substrate G. Accordingly, the temperature of the region around the substrate G can be prevented from being lowered due to the flow of air produced by ventilation, that is, due to disturbance, so that evenness of the processing temperature within the surface of the substrate G can be improved.

The gap D formed between the ventilation cover 51 and the shutter 60 of the heat processing device (HP) when the shutter 60 is moved to its uppermost position for the heating process is set so that the side air flow B may be suppressed by the supply air flow A to thereby reduce the temperature difference within the hot plate 42, whereby sudden heat removal from the side faces 42e of the hot plate 42 is prevented from being caused by a rapid side air flow B and thus the temperature difference between the central and peripheral portions of the hot plate 42 can be reduced. Accordingly, the thermal evenness of the hot plate 42 is enhanced, and as a result, evenness of the processing temperature within the surface of the substrate G improves. To attain these advantageous effects, the gap between the ventilation cover 51 and the shutter 60 is preferably set to 15 to 20 mm.

In the heating process described above, the shutter 60 is moved down and then the pins 44 are moved up to lift the substrate (STEPS 7 and 8), and this prevents the substrate G from being locally cooled by air impinging directly upon the substrate G at high flow rate. Such local cooling occurs because, where the amount of air ventilated is the same, the flow rate of air is higher and also the air flow is more localized when the shutter 60 is lifted than when the shutter 60 is lowered. After completion of the heating process, the shutter 60 is moved up in STEP 12 and the ventilation and the hot plate 42 are brought to the same state as that during the heating process, in order to maintain the thermal environment of the heat processing device (HP) also during the time other than the heating process and thereby prevent unevenness of the temperature of the region above the hot plate 42.

The hot plate 42 used is a press-fit type in which the heater 43 is embedded in the hot plate by press-fitting; therefore, there is no restriction on the plate thickness imposed by the manufacturing process, unlike the cast-type hot plate (of which the thickness is 40 mm or more), and a hot plate with a smaller thickness can be produced. Accordingly, the hot plate 42 can be reduced in thickness to thereby improve response to heat and reduce the weight, and also the height of the heat processing device (HP) can be reduced. Thus, the thickness of the hot plate 42 should desirably be as small as possible in view of reduction in size of the device and response to heat. If, however, the thickness of the hot plate is smaller than 25 mm, the heat processing device becomes susceptible to disturbances, and accordingly, in view of both reduction in size of the device and thermal evenness, an optimum thickness of the hot plate is 30 mm or thereabouts, for example.

The press-fit type hot plate has been considered so far to be poor in heat conductivity because of a layer of air present between the recess formed in the hot plate and the heater. In actuality, however, no significant adverse influence was observed and it was found that the press-fit type hot plate could be put to practical use satisfactorily.

As described above, with the heat processing device (HP) according to this embodiment, evenness of the processing temperature within the surface of the substrate G can be improved by using any one of the aforementioned various techniques, and where these techniques are used in combination, evenness of the processing temperature can be further enhanced by combined effects of the techniques.

Specifically, for a substrate G having a very large size of 840×650 mm, thermal evenness falling within a range of 1.5° C. can be achieved.

Figure 10:
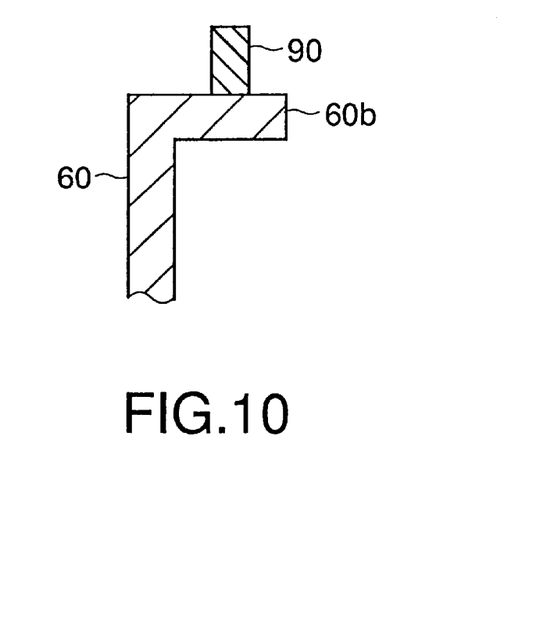
FIG. 10 is a sectional view showing a modification of a means for adjusting the gap between a ventilation cover and the shutter.
Figure 12:
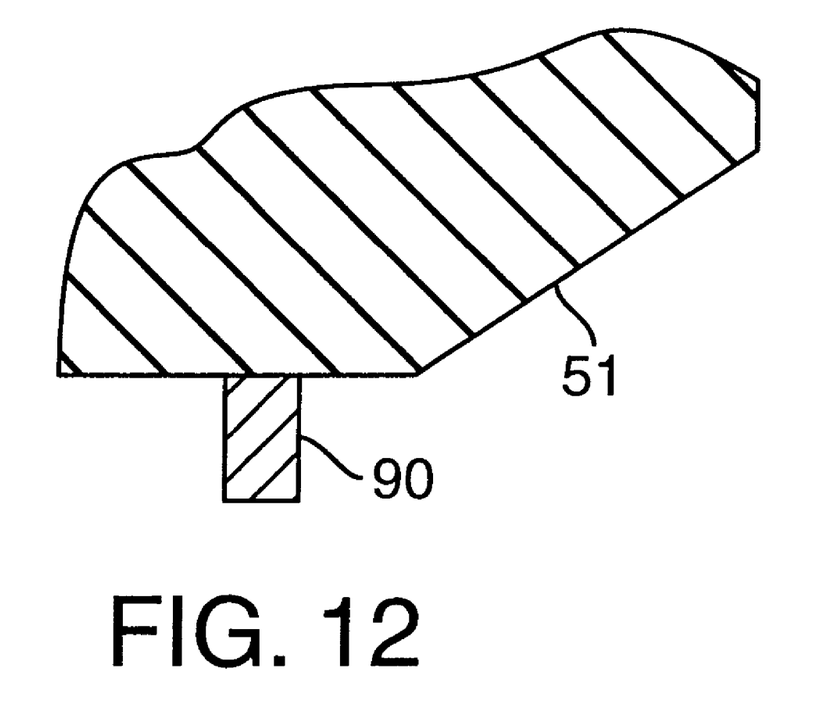
FIG. 12 is a sectional view showing yet another means for adjusting the gap between a ventilation cover and the shutter.

The present invention is not limited to the embodiment described above and may be modified in various ways. For example, in the foregoing embodiment, the stopper 55 is attached to each guide member 52, as shown in FIG. 6, to adjust the gap D between the ventilation cover 51 and the shutter 60 during the heating process. Alternatively, as shown in FIG. 10, a gap-setting protuberance 90 may be formed on the upper surface of the inwardly extending horizontal portion 60b of the shutter 60 at each of the four corners thereof so that the gap D may be determined by the height of the protuberances 90. Such gap-setting protuberances may of course be formed on the surface of the ventilation cover 51, as shown in FIG. 12.

Figure 11:
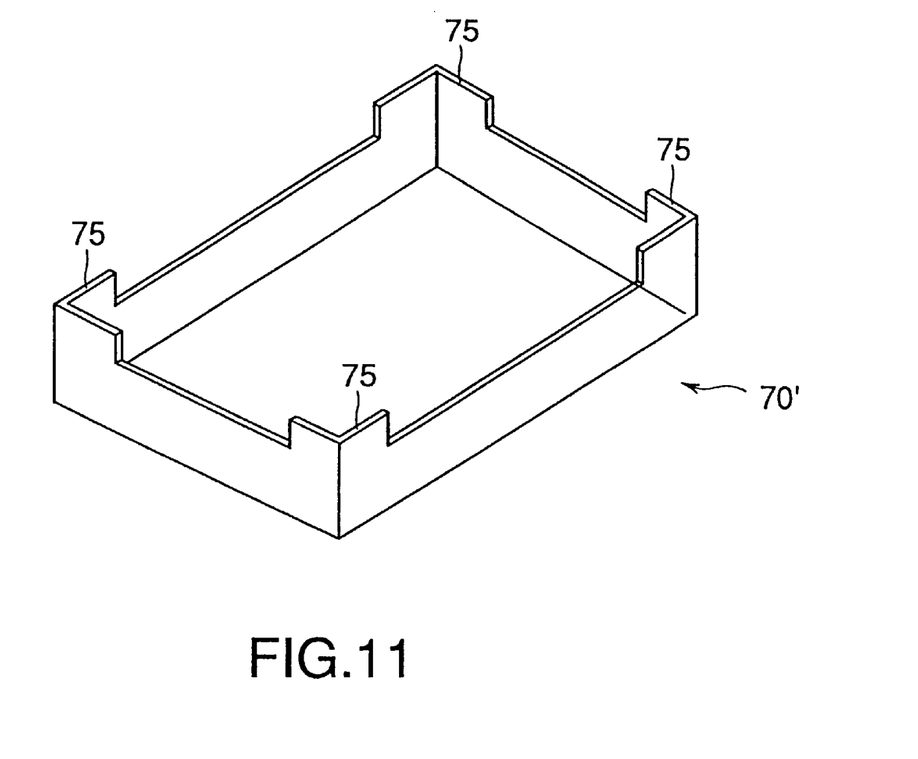
FIG. 11 is a perspective view showing a modification of a reflecting plate.

Also, since the corners of the hot plate 42 are cooled to a greater extent than the central portion of same, a reflecting plate 70' having increased-height portions 75 at four corners thereof, as shown in FIG. 11, may be used.

Although in the above embodiment, the present invention is applied to the heat processing device used in the resist coating-developing system, the application of the present invention is not limited to this alone and the invention may be applied to other processes. Further, in the foregoing embodiment, LCD substrate is taken as an example of a substrate, but the substrate is not limited to LCD substrate and the present invention can of course be applied to processing of other types of substrates.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heat processing device comprising:
   a casing;
   a hot plate arranged inside said casing for heating an object which is placed on or above said hot plate;
   a heater for heating said hot plate; and
   a reflecting plate for reflecting heat radiated from said hot plate,
   wherein said reflecting plate has a bottom portion facing an underside of said hot plate, and side wall portions facing respective side faces of said hot plate said side wall portions partially overlapping the side faces of said hot plate in a height direction of said reflecting plate, and said reflecting plate having at least one corner with an increased height relative to other portions thereof.

2. The heat processing device according to claim 1, wherein the side wall portions of said reflecting plate overlap with the respective side faces of said hot plate in the height direction by an amount corresponding to ⅓ to ½ of a thickness of said hot plate.

3. The heat processing device according to claim 1, wherein said hot plate has a rectangular shape corresponding to a rectangular shape of an object, the side wall portions of said reflecting plate surrounding said rectangular hot plate and having a plurality of corners with an increased height relative to other portions thereof.

4. A heat processing device according to claim 1, wherein said hot plate has a plurality of recesses formed in its underside, and said heater is formed of a pipe-shaped heater which is press-fitted in each of the recesses of said hot plate and embedded in said hot plate.

5. A heat processing device according to claim 1, which further includes:
   an outside frame arranged on a surface of said hot plate where the object is to be placed, said outside frame surrounding the object.

6. The heat processing device according to claim 5, wherein said outside frame has a height greater than that of the object.

7. A heat processing device according to claim 5, wherein said hot plate has a plurality of recesses formed in its underside that is opposite to the surface of the hot plate on which the object is placed, and said heater is formed of a pipe-shaped heater which is press-fitted in each of the recesses of said hot plate to be embedded in said hot plate.

8. A heat processing device according to claim 1 which further includes:
   a ventilation cover arranged above said hot plate with a processing space defined a therebetween and having a vent hole; and
   a shutter arranged so as to surround the processing space and movable toward and away from said ventilation cover,
   wherein a gap formed between said ventilation cover and said shutter during a heating process is set to a value of 15 to 20 mm such that, when the processing space is ventilated via the vent hole, a flow of air along side faces of said hot plate is suppressed by a flow of air introduced into the processing space through the gap, to thereby lessen variation in temperature of said hot plate.

9. The heat processing device according to claim 8, wherein said casing has at least two air inlet holes formed therein at locations opposite to each other immediately below said ventilation cover.

10. A heat processing device according to claim 8, wherein said hot plate has a plurality of recesses formed in its underside that is opposite to the surface of the hot plate on which the object is placed, and said heater is formed of a pipe-shaped heater which is press-fitted in each of the recesses of said hot plate to be embedded in said hot plate.

11. A heat processing device according to claim 8, wherein said shutter has a horizontal portion extending in a vicinity of a peripheral edge of said hot plate.

12. A heat processing device according to claim 11, wherein said horizontal portion has an edge portion which is overlapped with the peripheral edge of said hot plate.

13. A heat processing device according to claim 8, wherein said hot plate is made of an aluminum alloy.

14. A heat processing device according to claim 8, further comprising an outside frame arranged on a surface of said hot plate where the object is to be placed, said outside frame surrounding the object.

15. A heat processing device according to claim 8, further comprising a gap-setting protuberance formed proximate each of corners of said shutter.

16. A heat processing device according to claim 8, further comprising a plurality of gap-setting protuberances formed on a surface of said ventilation cover.

17. A heat processing device according to claim 1, wherein said reflecting plate has increased-height portions at four corners.

* * * * *